US012589464B2

(12) United States Patent
Yamaguchi et al.

(10) Patent No.: US 12,589,464 B2
(45) Date of Patent: Mar. 31, 2026

(54) PUSHER, TRANSFER DEVICE, AND SUBSTRATE PROCESSING APPARATUS

(71) Applicant: EBARA CORPORATION, Tokyo (JP)

(72) Inventors: Kuniaki Yamaguchi, Tokyo (JP); Kentaro Asano, Tokyo (JP); Dai Yoshinari, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 703 days.

(21) Appl. No.: 18/094,573

(22) Filed: Jan. 9, 2023

(65) Prior Publication Data

US 2023/0226662 A1 Jul. 20, 2023

(30) Foreign Application Priority Data

Jan. 19, 2022 (JP) ................................. 2022-006511

(51) Int. Cl.
*B24B 41/00* (2006.01)
*H01L 21/687* (2006.01)

(52) U.S. Cl.
CPC ........ *B24B 41/005* (2013.01); *H01L 21/6875* (2013.01)

(58) Field of Classification Search
CPC ... B24B 1/005; B24B 37/345; H01L 21/6875; H01L 21/67259; H01L 21/68707
See application file for complete search history.

(56) References Cited

U.S. PATENT DOCUMENTS 6,050,884 A * 4/2000 Togawa ................ B24B 41/005
451/73
2007/0111542 A1* 5/2007 Shinozaki ........... H01L 21/6831
118/52
2018/0001440 A1* 1/2018 Aono ................ H01L 21/68707

FOREIGN PATENT DOCUMENTS

JP 2010-050436 A 3/2010

* cited by examiner

*Primary Examiner* — Michael Collins
(74) *Attorney, Agent, or Firm* — Venjuris, P.C.

(57) ABSTRACT

A pusher that holds a substrate includes: a pusher body, and a plurality of seating members that is attached to the pusher body and on which a substrate is seated. Each of the plurality of seating members includes: a pedestal member including a seating portion on which the substrate is seated and a magnet disposed at a position different from the seating portion, and supported by the pusher body such that the position of the magnet is moved according to seating or leaving of the substrate; a seating sensor configured to detect movement of the magnet; and a magnetic member disposed to shield a portion between a movable region of the magnet and the seating sensor.

12 Claims, 13 Drawing Sheets

PUSHER, TRANSFER DEVICE, AND SUBSTRATE PROCESSING APPARATUS

CROSS-REFERENCE TO RELATED APPLICATIONS

This application is based on and claims priority from Japanese Patent Application No. 2022-006511, filed on Jan. 19, 2022 with the Japan Patent Office, the disclosure of which is incorporated herein in its entirety by reference.

TECHNICAL FIELD

The present disclosure relates to a pusher, a transfer device, and a substrate processing apparatus.

BACKGROUND

In recent years, a substrate processing apparatus has been used to perform various processings on a substrate such as a semiconductor wafer. An example of the substrate processing apparatus may include a chemical mechanical polishing (CMP) device that performs a polishing processing on a substrate.

As disclosed in Japanese Patent Laid-Open Publication No. 2010-050436, the CMP device includes a polishing device that performs a polishing processing on a substrate, a cleaning device that performs a cleaning processing and a drying processing on the substrate, and a loading/unloading device that delivers the substrate to the polishing device and receives the substrate that is cleaned and dried by the cleaning device. Further, the CMP device includes a transfer device that transfers the substrate among the polishing device, the cleaning device, and the loading/unloading device. The CMP device sequentially performs various processings such as polishing, cleaning, and drying while transferring the substrate by the transfer device.

The transfer device includes a hand that holds and support the substrate, and a driving mechanism that moves the hand. The hand is provided with a plurality of pins on which the substrate is seated, and is configured to detect that the substrate is seated on the pin. In order to detect the seating of the substrate, an optical sensor including a light transmitting portion and a light receiving portion is used. For example, the light receiving portion is provided in the pin, and the light transmitting portion is provided at a predetermined location apart from the pin, so that, when the substrate shields a space between the light transmitting portion and the light receiving portion, the seating of the substrate on the pin is detected.

SUMMARY

According to an embodiment, a pusher that holds and supports a substrate is disclosed. The pusher includes a pusher body, and a plurality of seating members that is attached to the pusher body and on which a substrate is seated, and each of the plurality of seating members includes: a pedestal member including a seating portion on which the substrate is seated and a magnet disposed at a position different from the seating portion, and supported by the pusher body so that the position of the magnet is moved according to seating or leaving of the substrate; a seating sensor configured to detect movement of the magnet; and a magnetic member disposed to shield a part of a portion between a movable region of the magnet and the seating sensor.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
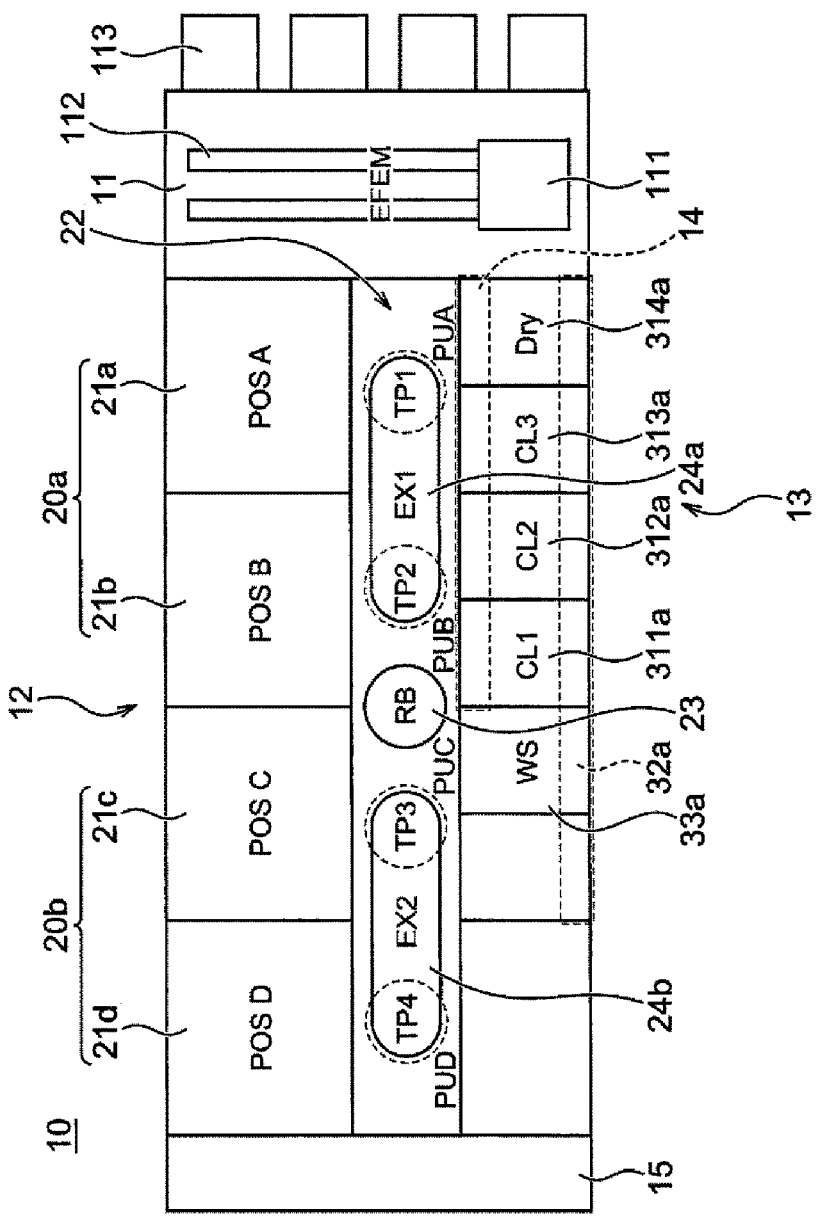
FIG. 1 is a plan view illustrating an overall configuration of a substrate processing apparatus of an embodiment of the present disclosure.

In the following detailed description, reference is made to the accompanying drawing, which form a part hereof. The illustrative embodiments described in the detailed description, drawings, and claims are not meant to be limiting. Other embodiments may be utilized, and other changes may be made, without departing from the spirit or scope of the subject matter presented here.

In the related art, there is a room for improvement in terms of increasing the accuracy for the detection of the seating of the substrate.

That is, in the detection of the seating in the related art, the optical sensor is disposed in the seating area in which the substrate is seated. Since cleaning water used in the cleaning processing or slurry used in the polishing processing exist in the seating area, the light of the optical sensor is diffusely reflected by the cleaning water or the slurry, which may cause erroneous detection of the seating of the substrate.

Therefore, the present disclosure is to increase the accuracy for the detection of the seating of the substrate.

Hereinafter, a pusher, a transfer device, a substrate processing apparatus, and a substrate transfer method according to an embodiment of the present disclosure will be described with reference to the drawings. In the drawings described below, the same or corresponding components are denoted by the same reference numerals, and redundant descriptions are omitted.

FIG. 1 is a plan view illustrating an overall configuration of a substrate processing apparatus according to an embodiment of the present disclosure. As illustrated in FIG. 1, a substrate processing apparatus 10 of the embodiment includes a housing having a substantially rectangular shape viewed in a plan view, and the inside of the housing is partitioned into a loading/unloading device 11, a polishing device 12, a cleaning device 13, and a transfer mechanism 14 by partition walls. These loading/unloading device 11, polishing device 12, cleaning device 13, and transfer mechanism 14 are independently assembled and independently exhausted. Further, the substrate processing apparatus 10 is provided with a controller 15 (also referred to as a control panel) that controls the operations of the loading/unloading device 11, the polishing device 12, the cleaning device 13, and the transfer mechanism 14.

(Loading/Unloading Device)

The loading/unloading device 11 includes a plurality (four in the illustrated example) of front loading devices 113 on which a substrate cassette on which a plurality of wafers (substrates) Wf is stocked is placed. The front loading device 113 is arranged adjacent in a width direction (perpendicular to the longitudinal direction) of the substrate processing apparatus 10. On the front loading device 113, an open cassette, a standard manufacturing interface (SMIF) pod, or a front opening unified pod (FOUP) may be mounted. Here, the SMIF and FOUP are closed containers that accommodate a substrate cassette therein, and may maintain an environment independent of the external space by being covered with partition walls.

Further, the loading/unloading device 11 is provided with a traveling mechanism 112 along the arrangement direction of the front loading devices 113, and a transfer robot 111 movable along the arrangement direction of the front loading device 113 is installed on the traveling mechanism 112. The transfer robot 111 is configured to be accessible to a substrate cassette mounted on the front loading device 113 by moving on the traveling mechanism 112. The transfer robot 111 includes two upper and lower hands. For example, the upper hand is used when the substrate Wf is returned to the substrate cassette, and the lower hand is used when the substrate Wf before being polished is transferred, so that the upper and lower hands may be used properly. Instead of this, one hand may be used to transfer the substrate Wf.

Since the loading/unloading device 11 is an area required to be kept in the cleanest state, the inside of the loading/unloading device 11 is maintained at a higher pressure than any one of the outside of the device, the polishing device 12, the cleaning device 13, and the transfer mechanism 14 all the time. Further, a filter fan unit (not illustrated) including a clean air filter such as a HEPA filter or an ULPA filter is provided above the traveling mechanism 112 of the transfer robot 111, and clean air from which particles, a toxic vapor, or a gas have been removed by this filter fan unit is constantly blown downward.

The transfer mechanism 14 is a device that transfers the substrate before being polished from the loading/unloading device 11 to the polishing device 12, and is provided to extend along the longitudinal direction of the substrate processing apparatus 10. As illustrated in FIG. 1, the transfer mechanism 14 is disposed adjacent to both the loading/unloading device 11 that is the cleanest area and the polishing device 12 that is the dirtiest area. As a result, in order to prevent the particles in the polishing device 12 from diffusing into the loading/unloading device 11 by passing through the transfer mechanism 14, as will be described later, an airflow flowing from the loading/unloading device 11 side to the polishing device 12 side is formed inside the transfer mechanism 14.

Figure 2:
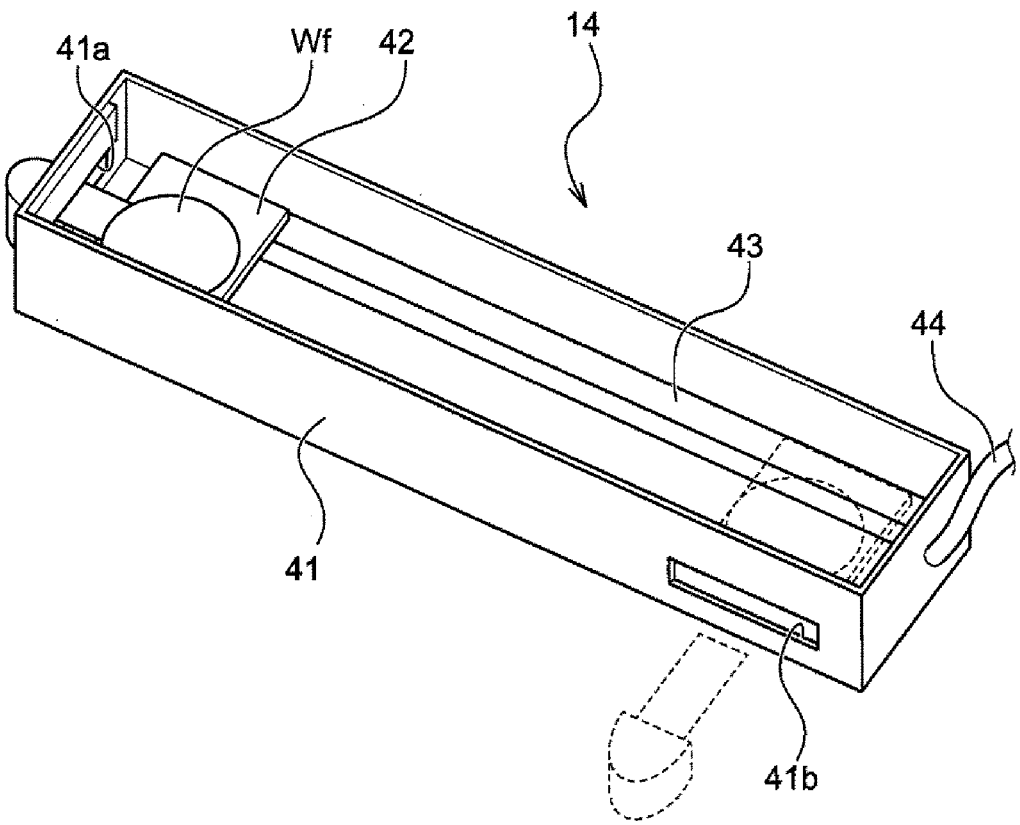
FIG. 2 is an exploded perspective view illustrating a transfer mechanism of the substrate processing apparatus illustrated in FIG. 1.

A structure of the transfer mechanism 14 will be described in detail. FIG. 2 is an exploded perspective view illustrating an internal configuration of the transfer mechanism 14. As illustrated in FIG. 2, the transfer mechanism 14 includes a cover 41 extending in the longitudinal direction, a slide stage 42 that is disposed inside the cover 41 and holds and supports the substrate Wf, a stage moving mechanism 43 that linearly moves the slide stage 42 along the longitudinal direction, and an exhaust duct 44 that exhausts the gas inside the cover 41.

The cover 41 includes a bottom surface plate, four side surface plates, and a ceiling surface plate (omitted in FIG. 2). Among these, in a side surface plate on one side in the longitudinal direction, a carrying-in port 41a that communicates with the loading/unloading device 11 is formed. Further, in an end portion of a side surface plate on one side in the width direction on a side opposite to the carrying-in port 41a, a carrying-out port 41b that communicates with the polishing device 12 is formed. The carrying-in port 41a and the carrying-out port 41b are openable/closable by a shutter (not illustrated). The transfer robot 111 of the loading/unloading device 11 is configured to be accessible from the carrying-in port 41a to the slide stage 42 inside the cover 41, and a transfer robot 23 of the polishing device 12 is configured to be accessible from the carrying-out port 41b to the slide stage 42 inside the cover 41.

As the stage moving mechanism 43, for example, a motor driving mechanism using a ball screw or an air cylinder may be used. It is desired to use a rodless cylinder as the stage moving mechanism 43, since dust generation from the sliding moving portion may be prevented. The slide stage 42 is fixed to a movable portion of the stage moving mechanism 43, and is linearly moved along the longitudinal direction inside the cover 41 by the power given from the stage moving mechanism 43.

Four pins are provided on an outer periphery of the slide stage 42 to protrude upward. The substrate Wf placed on the slide stage 42 by the transfer robot 111 of the loading/unloading device 11 is supported on the slide stage 42 in a state where the outer peripheral edge thereof is guided by the four pins and is positioned. The pins are made of resins such as polypropylene (PP), polychlorotrifluoroethylene (PCTFE), or polyetheretherketone (PEEK).

The exhaust duct 44 is provided in a side surface plate (side surface plate on a side opposite to the carrying-in port 41a) on another side in the longitudinal direction of the cover 41. By exhausting air through the exhaust duct 44 in a state where the carrying-in port 41a is opened, an airflow flowing from the carrying-in port 41a side to the carrying-out port 41b side is formed inside the cover 41. Therefore, the particles in the polishing device 12 are prevented from diffusing inside the loading/unloading device 11 by passing through the transfer mechanism 14.

(Cleaning Device)

The cleaning device 13 is a device that cleans the wafer after being polished. As illustrated in FIG. 1, the cleaning device 13 includes a plurality (four in the embodiment) of cleaning modules 311a, 312a, 313a, and 314a, a wafer station 33a, and a cleaning device transfer mechanism 32a that transfers the wafer W between each of the cleaning modules 311a to 314a and the wafer station 33a. The plurality of cleaning modules 311a to 314a and the wafer station 33a are disposed in series along the longitudinal direction of the substrate processing apparatus 10. A filter fan unit (not illustrated) including a clean air filter is provided above each of the cleaning modules 311a to 314a, and clean air from which particles have been removed by this filter fan unit is constantly blown downward.

(Polishing Device)

The polishing device 12 is a device that polishes the substrate Wf. As illustrated in FIG. 1, the polishing device 12 includes a first polishing unit 20*a* including a first polishing device 21*a* and a second polishing device 21*b*, a second polishing unit 20*b* including a third polishing device 21*c* and a fourth polishing device 21*d*, and a polishing device transfer mechanism 22 disposed adjacent to each of the transfer mechanism 14, the first polishing unit 20*a*, and the second polishing unit 20*b*. The polishing device transfer mechanism 22 is disposed between the cleaning device 13 and the first polishing unit 20*a* and the second polishing unit 20*b* in the width direction of the substrate processing apparatus 10.

The first polishing device 21*a*, the second polishing device 21*b*, the third polishing device 21*c*, and the fourth polishing device 21*d* are arranged along the longitudinal direction of the substrate processing apparatus 10. Since the second polishing device 21*b*, the third polishing device 21*c*, and the fourth polishing device 21*d* have the same configuration as the first polishing device 21*a*, the first polishing device 21*a* will be described below.

Figure 3:
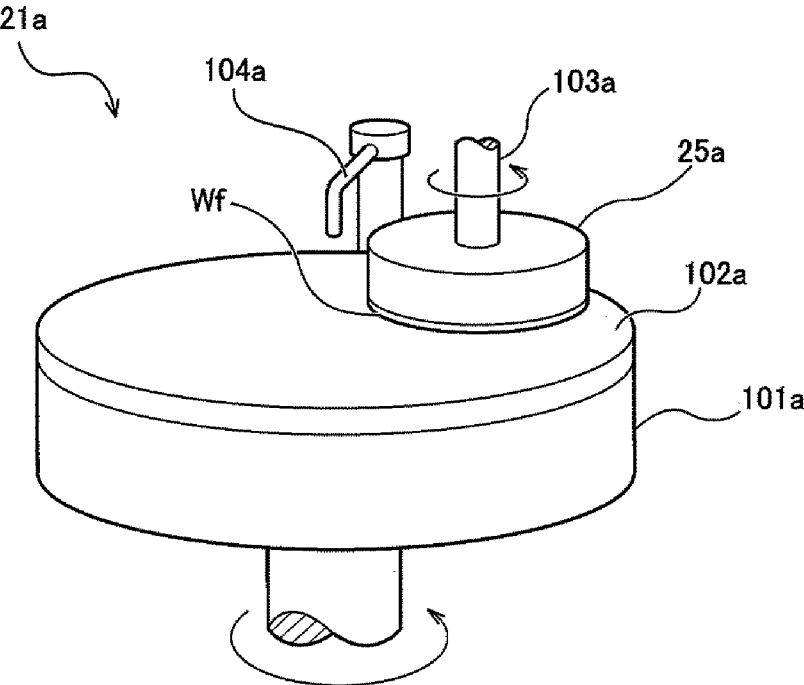
FIG. 3 is a schematic perspective view illustrating a first polishing device of the substrate processing apparatus illustrated in FIG. 1.

FIG. 3 is a schematic perspective view illustrating the first polishing device 21*a*. The first polishing device 21*a* includes a polishing table 101*a* on which a polishing pad 102*a* including a polishing surface is attached, a top ring 25*a* that holds and supports the substrate Wf and polishes the substrate Wf while pressing against the polishing pad 102 on the polishing table 101*a*, a polishing liquid supply nozzle 104*a* that supplies a polishing liquid (also referred to as slurry) or a dressing liquid (e.g., pure water) to the polishing pad 102*a*, a dresser (not illustrated) that performs dressing on the polishing surface of the polishing pad 102*a*, and an atomizer (not illustrated) that sprays a mixed gas of a liquid (e.g., pure water) and a gas (e.g., nitrogen gas) or a liquid (e.g., pure water) in a mist form to the polishing surface.

The top ring 25*a* is supported by a top ring shaft 103*a*. The polishing pad 102*a* is adhering to an upper surface of the polishing table 101*a*, and the upper surface of the polishing pad 102*a* constitutes the polishing surface that polishes the substrate Wf. A fixed whetstone may also be used instead of the polishing pad 102*a*. As illustrated by an arrow in FIG. 3, the top ring 25*a* and the polishing table 101*a* are configured to rotate around the axes thereof. The substrate Wf is held and supported at a lower surface of the top ring 25*a* by vacuum adsorption. During the polishing, the polishing liquid is supplied from the polishing liquid supply nozzle 104*a* to the polishing surface of the polishing pad 102*a*, and the substrate Wf, which is a polishing target, is polished by being pressed against the polishing surface by the top ring 25*a*.

During the polishing, as can be seen by considering the use of slurry, the polishing device 12 is the dirtiest (soiled) area. Therefore, in the embodiment, in order to prevent the scattering of the particles in the polishing device 12 to the outside, exhaust is performed from the surroundings of each polishing table of the first polishing device 21*a*, the second polishing device 21*b*, the third polishing device 21*c*, and the fourth polishing device 21*d*, and the pressure inside the polishing device 12 set to be lower than the outside of the device, the surrounding cleaning device 13, the loading/unloading device 11, and the transfer mechanism 14, so as to prevent the scattering of the particles. Further, in general, an exhaust duct (not illustrated) is provided below the polishing table, and a filter (not illustrated) is provided in the above, respectively, and purified air is blown out through the exhaust duct and the filter, and thus, a downflow is formed.

As illustrated in FIG. 1, the top ring 25*a* of the first polishing device 21*a* is moved between the polishing position and a first substrate transfer position TP1 by a swing operation of a top ring head, and the delivery of the substrate to the first polishing device 21*a* is performed at the first substrate transfer position TP1. In the same manner, a top ring 25*b* of the second polishing device 21*b* is moved between the polishing position and a second substrate transfer position TP2 by a swing operation of a top ring head, and the delivery of the substrate to the second polishing device 21*b* is performed at the second substrate transfer position TP2. A top ring 25*c* of the third polishing device 21*c* is moved between the polishing position and a third substrate transfer position TP3 by a swing operation of a top ring head, and the delivery of the substrate to the third polishing device 21*c* is performed at the second substrate transfer position TP3. A top ring 25*d* of the fourth polishing device 21*d* is moved between the polishing position and a fourth substrate transfer position TP4 by a swing operation of a top ring head, and the delivery of the substrate to the fourth polishing device 21*d* is performed at the second substrate transfer position TP4.

The polishing device transfer mechanism 22 includes a first transfer device 24*a* that transfers the substrate Wf to the first polishing unit 20*a*, and a second transfer device 24*b* that transfers the substrate Wf to the second polishing unit 20*b*. Further, the polishing device transfer mechanism 22 includes the transfer robot 23 that is disposed between the first transfer device 24*a* and the second transfer device 24*b*, and delivers the substrate between the transfer mechanism 14 and the first transfer device 24*a* and the second transfer device 24*b*. In the illustrated example, the transfer robot 23 is disposed substantially in the center of the housing of the substrate processing apparatus 10.

Figure 4:
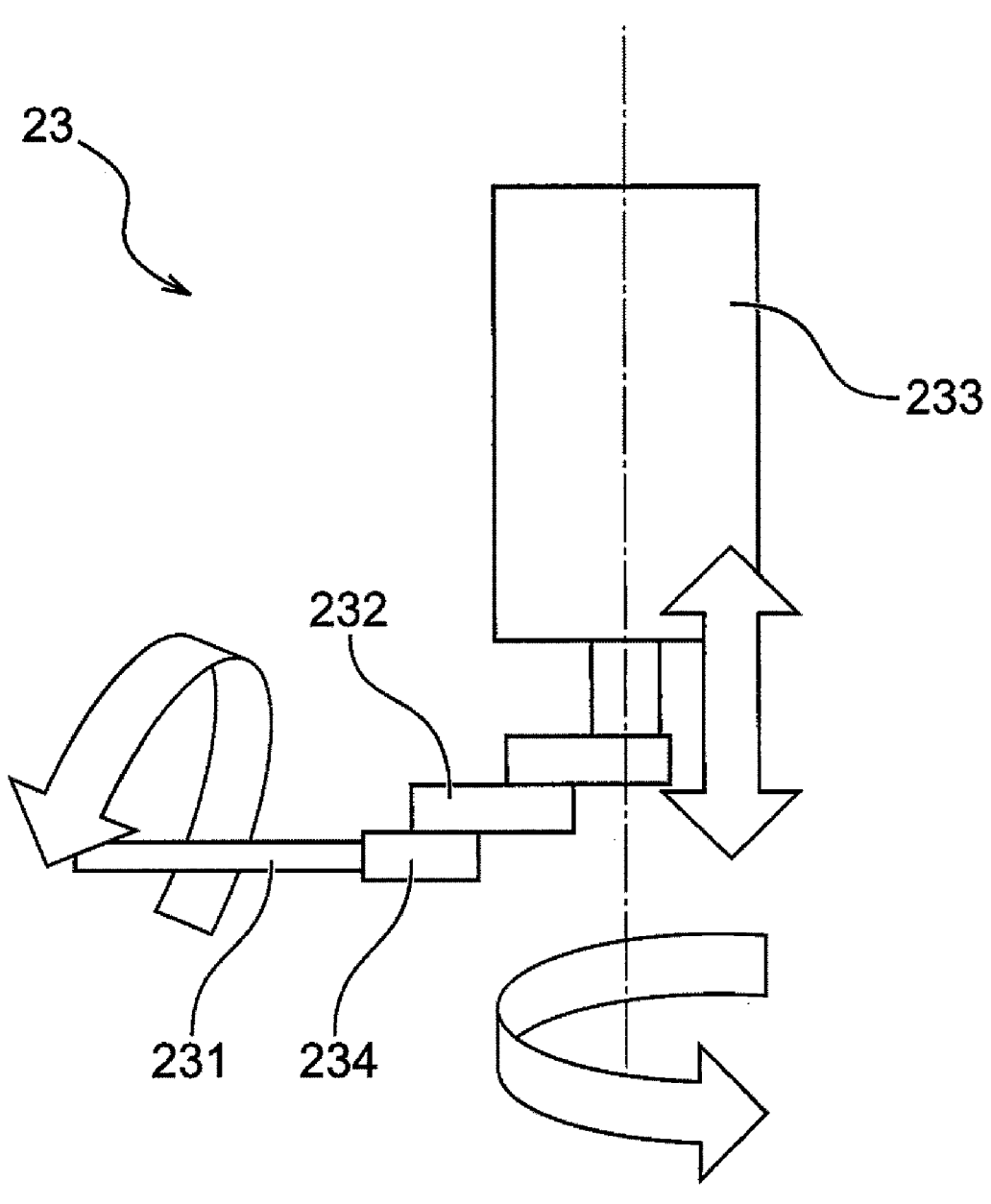
FIG. 4 is a side view of a transfer robot of the substrate processing apparatus illustrated in FIG. 1.

FIG. 4 is a side view illustrating the transfer robot 23. As illustrated in FIG. 4, the transfer robot 23 includes a hand 231 that holds and supports the substrate Wf, a reversing mechanism 234 that vertically reverses the hand 231, an arm 232 that supports the hand 231 and is extendable, and a robot body 233 including an arm vertical movement mechanism that moves the arm 232 up and down and an arm rotation mechanism that rotates the arm 232 around a vertical axis. The robot body 233 is attached to be suspended with respect to a frame of the ceiling of the polishing device 12.

In the embodiment, the hand 231 is configured to be accessible from the carrying-out port 41*b* of the transfer mechanism 14 to the slide stage 42. Further, the hand 231 is configured to be accessible to the first transfer device 24*a* and the second transfer device 24*b* of the polishing device 12. Therefore, the substrates Wf continuously transferred from the transfer mechanism 14 to the polishing device 12 are distributed to the first transfer device 24*a* and the second transfer device 24*b* by the transfer robot 23. Since the second transfer device 24*b* has the same configuration as the first transfer device 24*a*, the first transfer device 24*a* will be described below.

(First Transfer Device)

Figure 5:
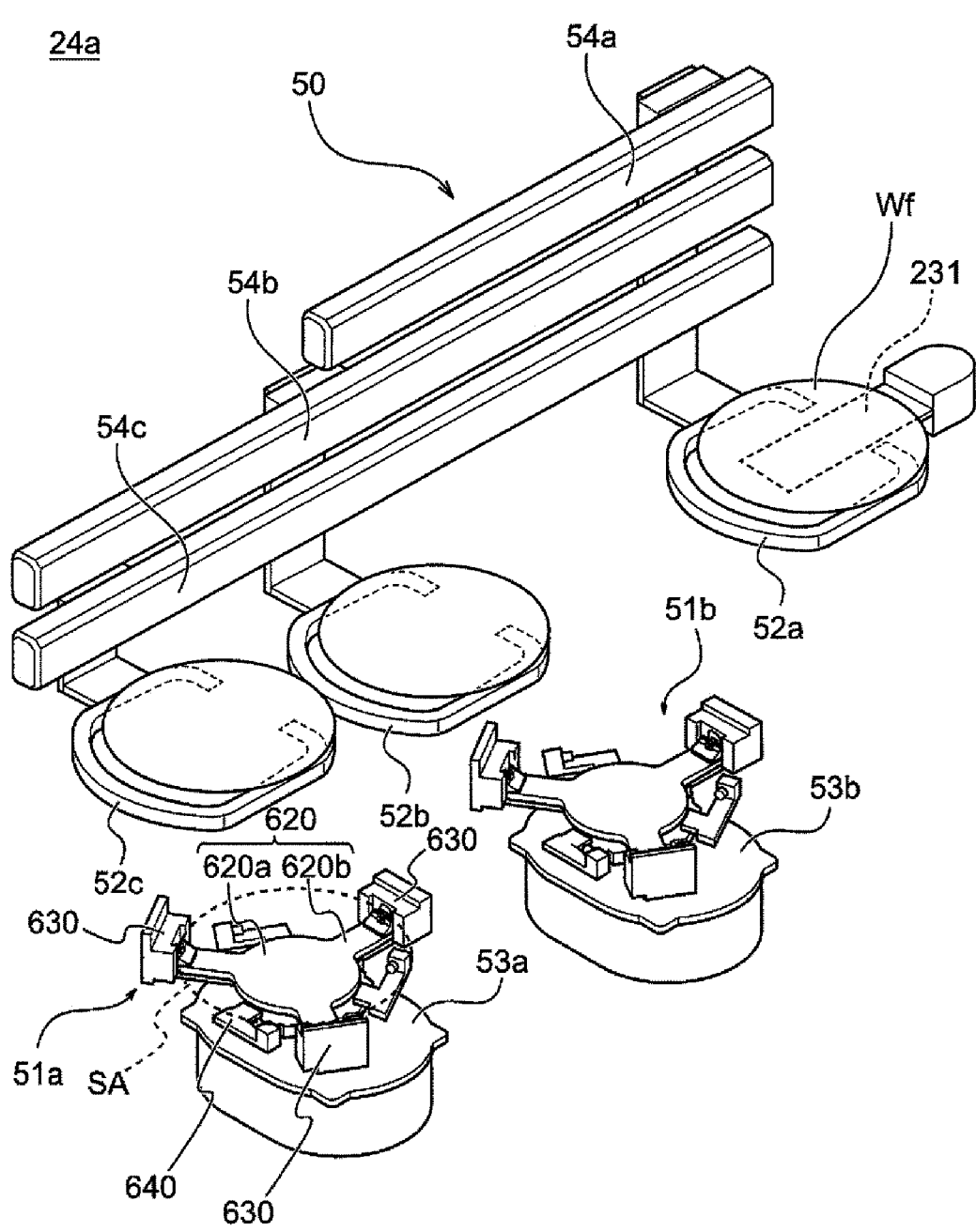
FIG. 5 is a perspective view illustrating a first transfer device.

FIG. 5 is a perspective view illustrating the first transfer device 24*a*. As illustrated in FIG. 5, the first transfer device 24*a* includes a pusher 51*a* disposed at the first substrate transfer position TP1 with respect to the first polishing device 21*a*, and an elevating mechanism 53*a* that moves the pusher 51*a* up and down. Further, the first transfer device 24*a* includes a pusher 51*b* disposed at the second substrate transfer position TP2 with respect to the second polishing device 21b, and an elevating mechanism 53b that moves the pusher 51b up and down.

Further, the first transfer device 24a includes exchangers 52a, 52b, and 52c configured to hold and support the substrate Wf. The exchangers 52a to 52c are disposed on the same axes passing through the first substrate transfer position TP1 and the second substrate transfer position TP2 when viewed in a plan view, but the disposed positions in the height direction are different from each other. That is, the exchanger 52a is disposed in a lower stage, the exchanger 52b is disposed in a middle stage, and the exchanger 52c is disposed in an upper stage. The first transfer device 24a includes driving mechanisms 54a, 54b, and 54c configured to linearly move the exchangers 52a to 52c in the direction perpendicular to the elevation direction of the pushers 51a and 51b. As the driving mechanisms 54a, 54b, and 54c, for example, a motor driving mechanism using an electric actuator or a ball screw is used. The exchangers 52a to 52c are configured to be movable in different directions at different timings by receiving power from different driving mechanisms 54a, 54b, and 54c, respectively. As described above, since the exchangers 52a to 52c are installed at different heights, the exchangers 52a to 52c are configured to be freely movable without interfering with each other. Therefore, the exchangers 52a to 52c are configured to horizontally move independently between the first substrate transfer position TP1 and the second substrate transfer position TP2.

The pusher 51a delivers the substrate Wf that is held and supported by any one of the exchangers 52a to 52c to the top ring 25a of the first polishing device 21a, and delivers the substrate Wf after being polished in the first polishing device 21a to any one of the exchangers 52a to 52c. Further, the pusher 51b delivers the substrate Wf that is held and supported by any one of the exchangers 52a to 52c to the top ring 25b of the second polishing device 21b, and delivers the substrate Wf after being polished in the second polishing device 21b to any one of the exchangers 52a to 52c. As described above, the pusher 51a and the pusher 51b have a function of delivering the substrate Wf between the exchangers 52a to 52c and each top ring. Since the pusher 51b has the same configuration as the pusher 51a, in the following descriptions, the pusher 51a will be described.

(Pusher)

As illustrated in FIG. 5, the pusher 51a includes a pusher body 620 and a plurality (three in the embodiment) of seating members 630 attached to the pusher body 620. The pusher body 620 includes a base member 620a having a circular shape, and three arm members 620b extending in a radial direction from the base member 620a. The arm members 620b are attached to the base member 620a at an interval of approximately 120°. Further, the pusher 51a includes a plurality (three in the embodiment) of cleaning devices 640 that cleans the substrate Wf. The cleaning device 640 is disposed between adjacent arm members 620b.

The plurality of seating members 630 are members on which the substrate is seated. The plurality of seating members 630 are attached to an end portion of the arm member 620b at a predetermined interval (approximately 120°) so as to surround a seating area SA in which the substrate is seated. In the embodiment, the example in which the pusher 51a includes three seating members 630, but the number of the seating members 630 is arbitrary. The pusher 51a may include three or more seating members 630 capable of hold and supporting the substrate Wf as horizontally as possible, and evenly distributing the weight of the substrate Wf. Since the plurality of seating members 630 have the same configuration, one seating member 630 will be described below.

Figure 6:
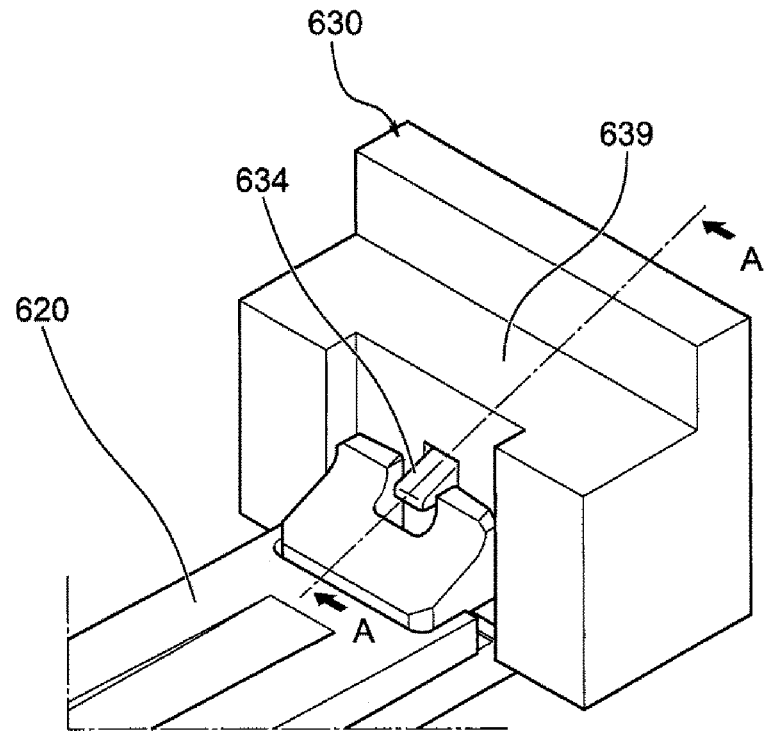
FIG. 6 is an enlarged perspective view illustrating a seating member.
Figure 7:
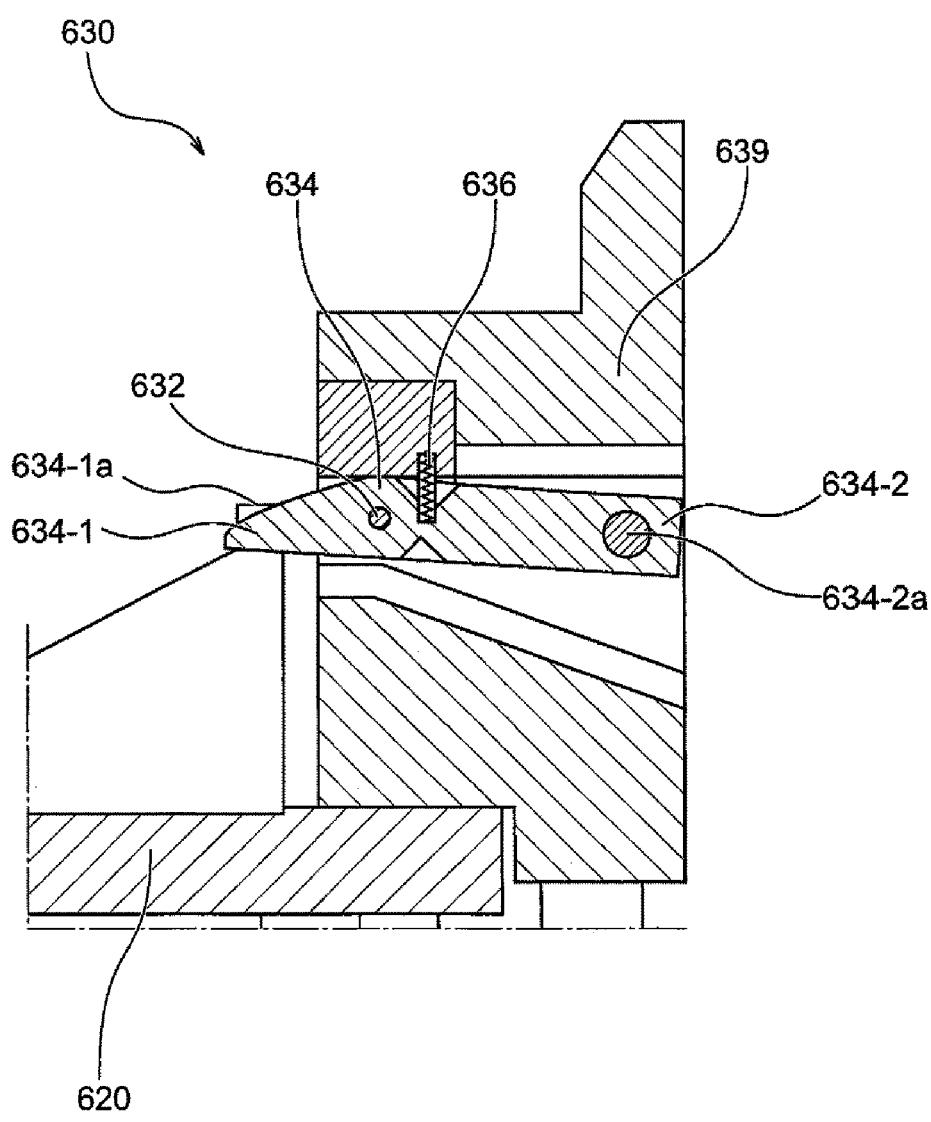
FIG. 7 is a cross-sectional view taken along line A-A of FIG. 6.
Figure 8:
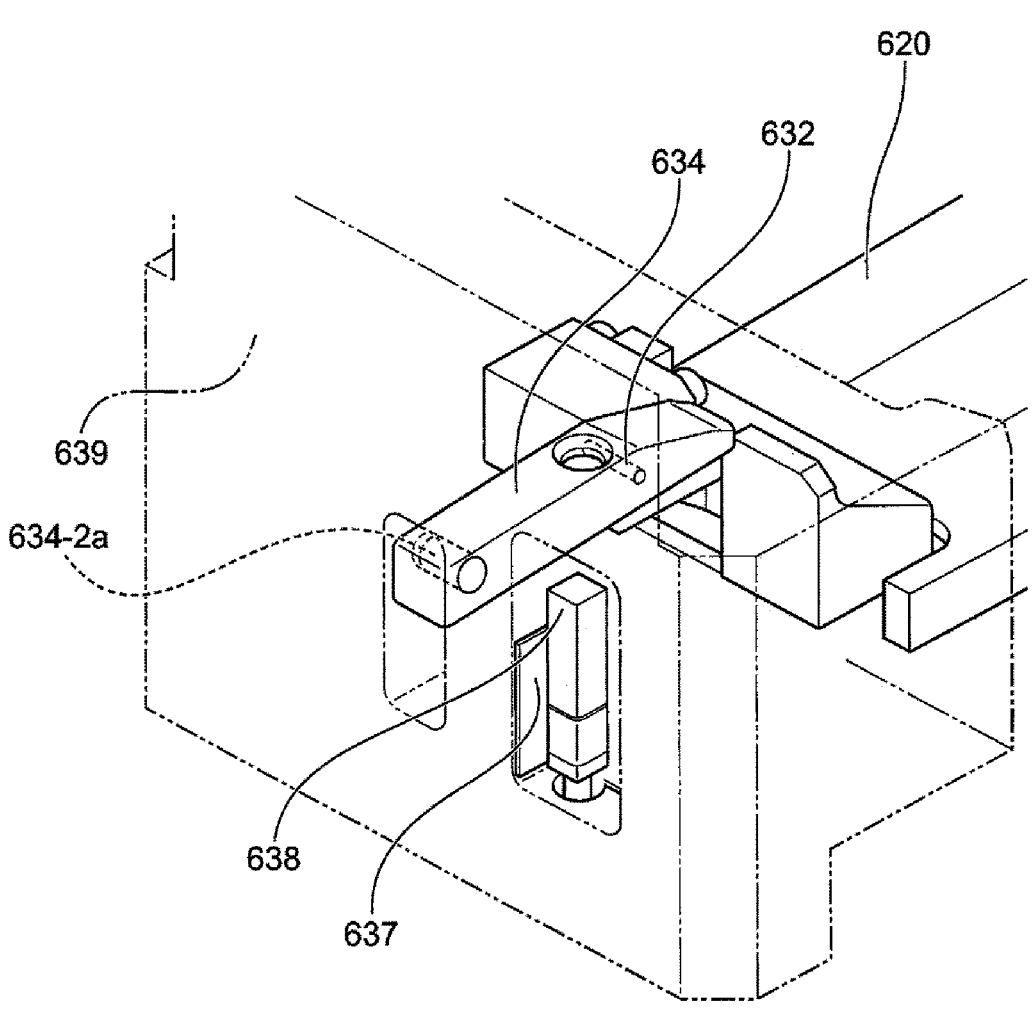
FIG. 8 is an enlarged perspective view illustrating a seating member.

FIG. 6 is an enlarged perspective view illustrating the seating member. FIG. 7 is a cross-sectional view taken along line A-A of FIG. 6. FIG. 8 is an enlarged perspective view illustrating the seating member.

As illustrated in FIGS. 6 to 8, the seating member 630 includes a shaft member 632 supported by the pusher body 620 and a lever member 634 supported by the shaft member 632. The lever member 634 is an embodiment of a pedestal member on which the substrate Wf is seated, and is a member having a rod shape extending in the same direction as the extension direction of the arm member 620b. The lever member 634 includes a first end portion 634-1 including a seating portion 634-1a on which the substrate is seated, and a second end portion 634-2 provided on a side opposite to the first end portion 634-1 with the shaft member 632 interposed therebetween. A magnet 634-2a is provided in the second end portion 634-2. The lever member 634 is supported by the shaft member 632 such that the first end portion 634-1 protrudes into the seating area SA.

The seating member 630 includes a biasing member 636 that imparts a force to the lever member 634 to rotate the lever member 634 about the shaft member 632. The biasing member 636 imparts the force to the lever member 634 to rotate the lever member 634 such that the magnet 634-2a provided in the second end portion 634-2 is moved downward. Therefore, when the substrate is not seated on the lever member 634, the second end portion 634-2 (magnet 634-2a) is in a state of being moved downward. In the embodiment, the biasing member 636 is a compression spring. Specifically, the compression spring is configured such that one end is attached to a housing 639 that covers an upper portion of the lever member 634 and the other end is attached to a hole formed in an upper surface of the lever member 634 closer to the second end portion 634-2 side from the shaft member 632. The biasing member 636 is not limited to the compression spring, and any member that imparts the biasing force to the lever member 634 can be used, and an elastic body such as rubber may be applied. Since the lever member 634 is supported by the biasing member 636, it is possible to absorb the impact when the substrate Wf is seated on the lever member 634.

The seating member 630 includes a seating sensor 638 that detects that the substrate is seated on the pusher 51a, and the housing 639 configured to cover the second end portion 634-2 of the lever member 634 and the seating sensor 638. The seating sensor 638 is configured to detect that the second end portion 634-2 (magnet 634-2a) is moved upward. The lever member 634 is supported by the pusher body 620 such that the position of the magnet 634-2a is moved according to the seating or the leaving of the substrate. That is, when the substrate is not seated on the lever member 634, the biasing member 636 biases the lever member 634 so that the magnet 634-2a is in a state of being positioned downward. Meanwhile, when the substrate is seated on the seating portion 634-1a of the lever member 634, the lever member 634 is rotated about the shaft member 632 due to the weight of the substrate, so that the first end portion 634-1 is moved downward and the second end portion 634-2 is moved upward. The seating sensor 638 is configured to include a magnetic sensor that detects that the magnet 634-2a is moved upward. When the magnet 634-2a is moved upward and approaches the magnetic sensor, the seating sensor 638 detects the change in magnetic resistance, thereby detecting that the second end portion 634-2 is moved upward, in other words, that the substrate is seated on the seating portion 634-1$a$ of the lever member 634.

Further, as illustrated in FIG. 8, the seating member 630 further includes a magnetic member 637 disposed to shield a part of a space between a movable region of the magnet 634-2$a$ in the vertical direction and the seating sensor 638. The magnetic member 637 is disposed between the magnet 634-2$a$ and the seating sensor 638, and is a metal plate member extending in the vertical direction. The magnetic member 637 is disposed so as to shield a space between a lower portion of the movable region of the magnet 634-2$a$ and the seating sensor 638, and to not shield a space between an upper portion of the movable region of the magnet 634-2$a$ and the seating sensor 638.

According to the embodiment, it is possible to increase the accuracy for the detection of the seating of the substrate with respect to the pusher Ma. That is, in the related art, the detection of the seating is performed by using the optical sensor provided in the seating portion 634-1$a$. Here, since the seating portion 634-1$a$ is at a position protruding into the seating area SA, and cleaning water used in the cleaning processing by the cleaning device 640 or slurry used in the polishing processing exist in the seating area SA, the light of the optical sensor was diffusely reflected by the cleaning water or the slurry, which may cause erroneous detection of the seating of the substrate. In contrast, in the embodiment, the seating sensor 638 is configured to detect the seating by detecting the upward movement of the magnet 634-2$a$. The magnet 634-2$a$ is on the side opposite to the first end portion 634-1 including the seating portion 634-1$a$ with the shaft member 632 interposed therebetween so as to be separated from the seating area SA. Therefore, the magnet 634-2$a$ is less likely to be affected by the disturbance due to the cleaning water or the slurry, and thus, it is possible to increase the accuracy for the detection of the seating of the substrate.

Further, in the embodiment, since the magnet 634-2$a$ and the seating sensor 638 are covered with the housing 639, it is much less likely to be affected by the disturbance due to the cleaning water or the slurry, and thus, it is possible to increase the accuracy for the detection of the seating of the substrate. Further, in the embodiment, since the magnetic member 637 is disposed between the magnet 634-2$a$ and the seating sensor 638, it is possible to prevent the seating sensor 638 from erroneously detecting the seating of the substrate when the magnet 634-2$a$ is in the lower portion of the movable region. In other words, according to the embodiment, since the seating sensor 638 can detect the seating of the substrate when the magnet 634-2$a$ is in the upper portion of the movable region, it is possible to increase the accuracy for the detection of the seating of the substrate. Further, due to the increase in the accuracy for the detection of the seating of the substrate, it is possible to reduce the tact time for the substrate processing in the substrate processing apparatus. That is, due to the increase in the accuracy for the detection of the seating of the substrate, it is possible to vary the elevation speed of the pusher 51$a$ using the detection of the seating of the substrate as a trigger. For example, a case where the pusher 51$a$ receives the substrate that is held and supported by the exchanger 52$a$ will be described as an example. The pusher 51$a$ is raised at a high speed until the substrate is received (seating is detected), and after receiving the substrate (detecting the seating), the pusher 51$a$ is raised at a low speed. As a result, the overall tact time may be reduced.

Figure 9:
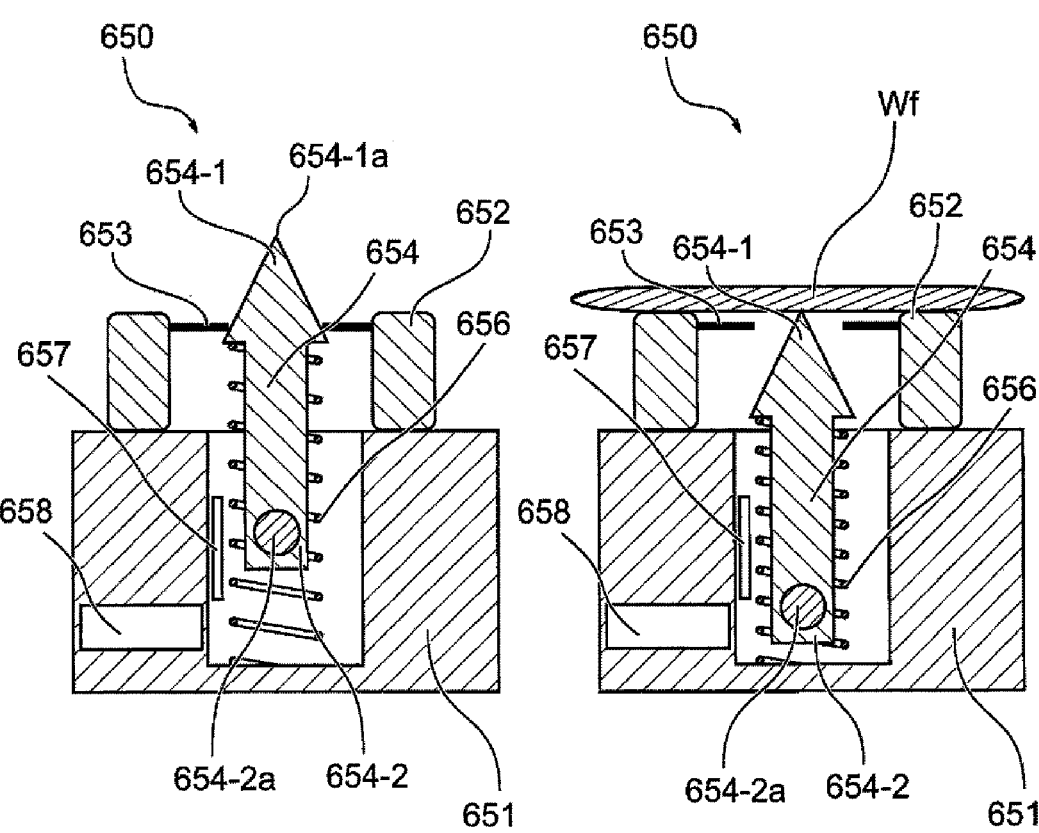
FIG. 9 is a cross-sectional view illustrating another example of the seating member.

In the embodiment, the example where the seating member 630 is the lever-type seating member has been described, but the present disclosure is not limited thereto. FIG. 9 is a cross-sectional view illustrating another example of the seating member. As illustrated in FIG. 9, a seating member 650 includes a base 651, a support member 652 disposed on the base 651, and a plate-shaped stopper 653 attached to the support member 652. Further, the seating member 650 includes a seating pin 654, which is an embodiment of a pedestal member on which the substrate Wf is seated. The seating pin 654 is a member having a rod shape extending in the vertical direction, and includes a first end portion 654-1 including a seating portion 654-1$a$ on which the substrate is seated and a second end portion 654-2 positioned below the first end portion 654-1. Similarly to the above embodiment, a magnet 654-2$a$ is provided in the second end portion 654-2.

The seating portion 650 includes a spring member 656, which is an embodiment of an elastic member that supports the seating pin 654 to be movable in the vertical direction. In the example, the spring member 656 is a compression coil spring, and is disposed in a hole formed in an upper surface of the base 651. Since the seating pin 654 is supported by the spring member 656, when the substrate Wf is left, the seating pin 654 is biased upward by the spring member 656. As illustrated in the drawing on the left side in FIG. 9, when the seating pin 654 is moved upward to a predetermined position, the seating pin 654 is bought into contact with the stopper 653. Therefore, the upward movement of the seating pin 654 is limited. Meanwhile, as illustrated in the drawing on the right side in FIG. 9, when the substrate Wf is seated on the seating pin 654, the seating pin 654 is moved downward due to the weight of the substrate Wf, and the substrate Wf is supported by the support member 652. Since the seating pin 654 is supported by the spring member 656, it is possible to absorb the impact when the substrate Wf is seated on the seating pin 654.

The seating member 650 includes a seating sensor 658 that detect that the substrate is seated on the pusher 51$a$. The seating sensor 658 is disposed in the lower portion of the base 651, and is configured to detect that the second end portion 654-2 (magnet 654-2$a$) is moved downward. The seating sensor 658 is configured to include a magnetic sensor that detects that the magnet 654-2$a$ is moved downward. When the magnet 654-2$a$ is moved downward and approaches the magnetic sensor, the seating sensor 658 detects the change in magnetic resistance, thereby detecting that the second end portion 654-2 is moved downward, in other words, that the substrate is seated on the seating portion 654-1$a$ of the seating pin 654.

Further, the seating member 650 includes a magnetic member 657 disposed to shield a part of a space between a movable region of the magnet 654-2$a$ in the vertical direction and the seating sensor 658. The magnetic member 657 is disposed between the magnet 654-2$a$ and the seating sensor 658, and is a metal plate member extending in the vertical direction. The magnetic member 657 is disposed so as to shield a space between an upper portion of the movable region of the magnet 654-2$a$ and the seating sensor 658, and to not shield a space between a lower portion of the movable region of the magnet 654-2$a$ and the seating sensor 658. In this modification, since the magnetic member 657 is disposed between the magnet 654-2$a$ and the seating sensor 658, it is possible to prevent the seating sensor 658 from erroneously detecting the seating of the substrate when the magnet 654-2$a$ is in the upper portion of the movable region. (Exchanger)

Figure 10:
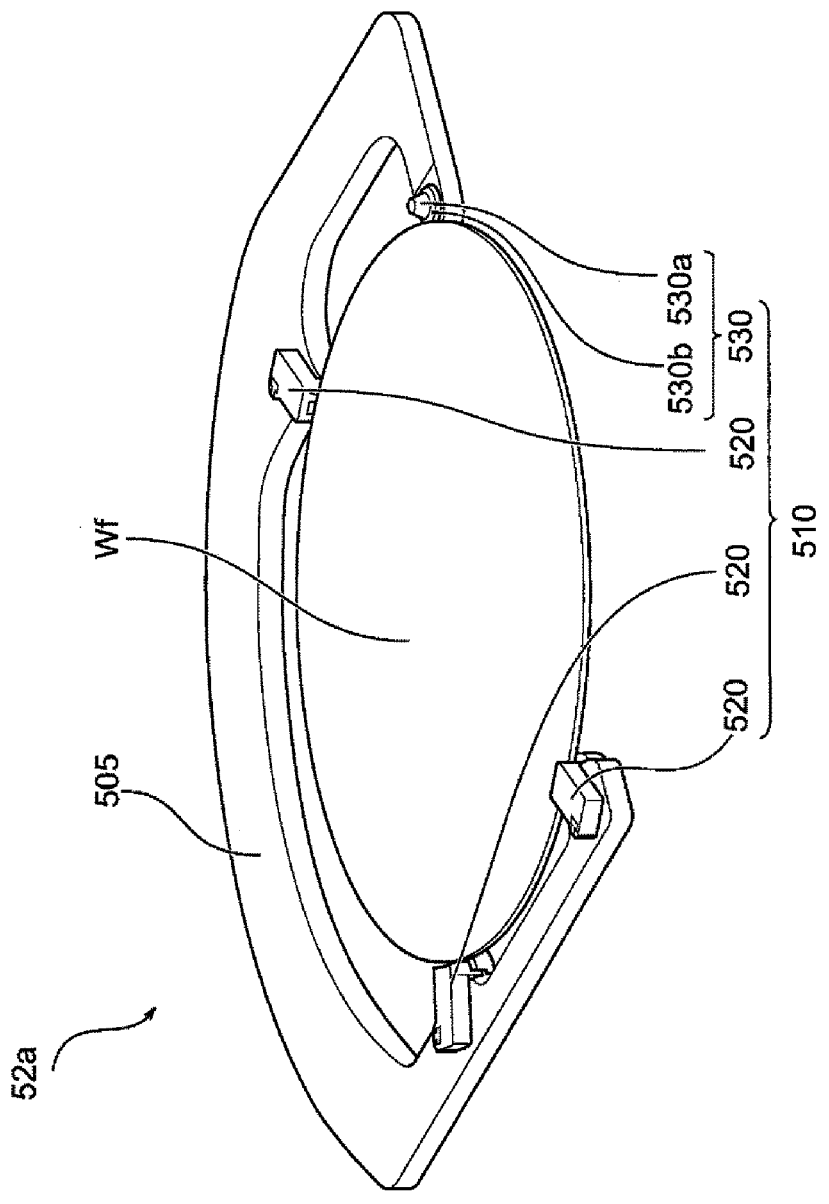
FIG. 10 is a perspective view of an exchanger.
Figure 11:
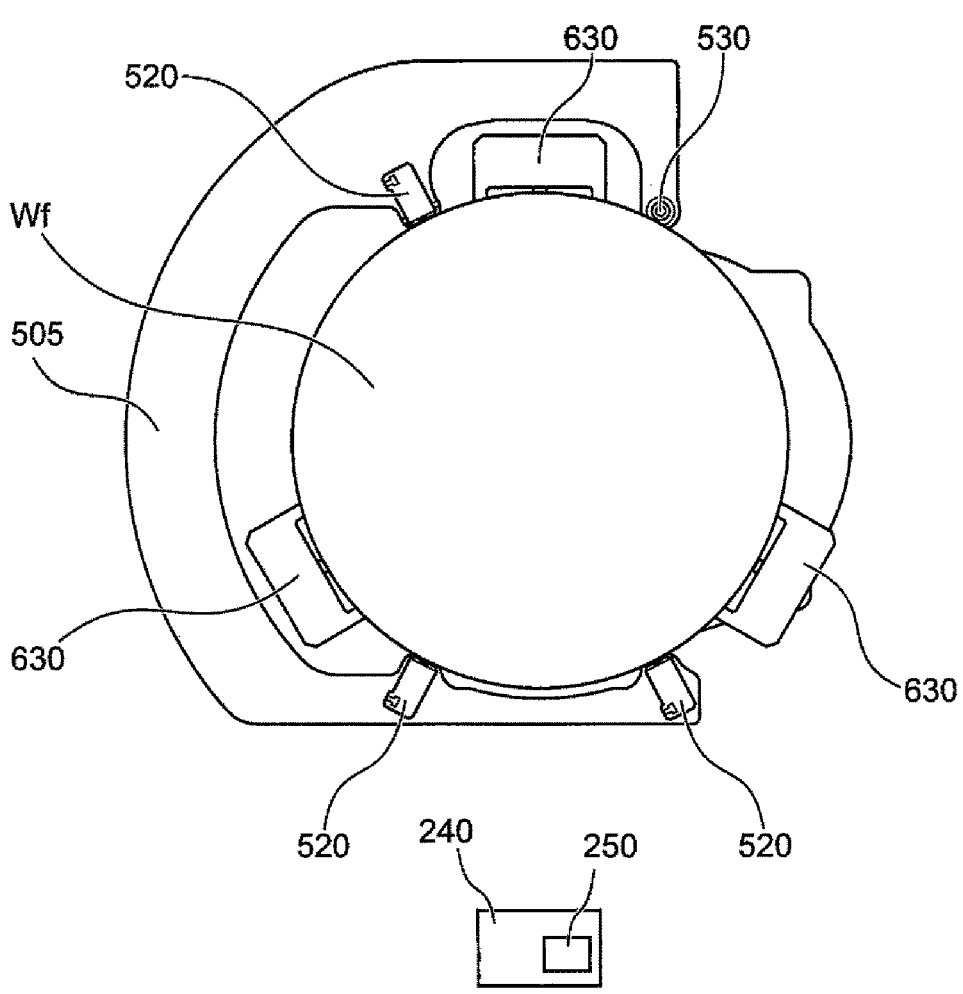
FIG. 11 is a plan view of a pusher and the exchanger.
Figure 12:
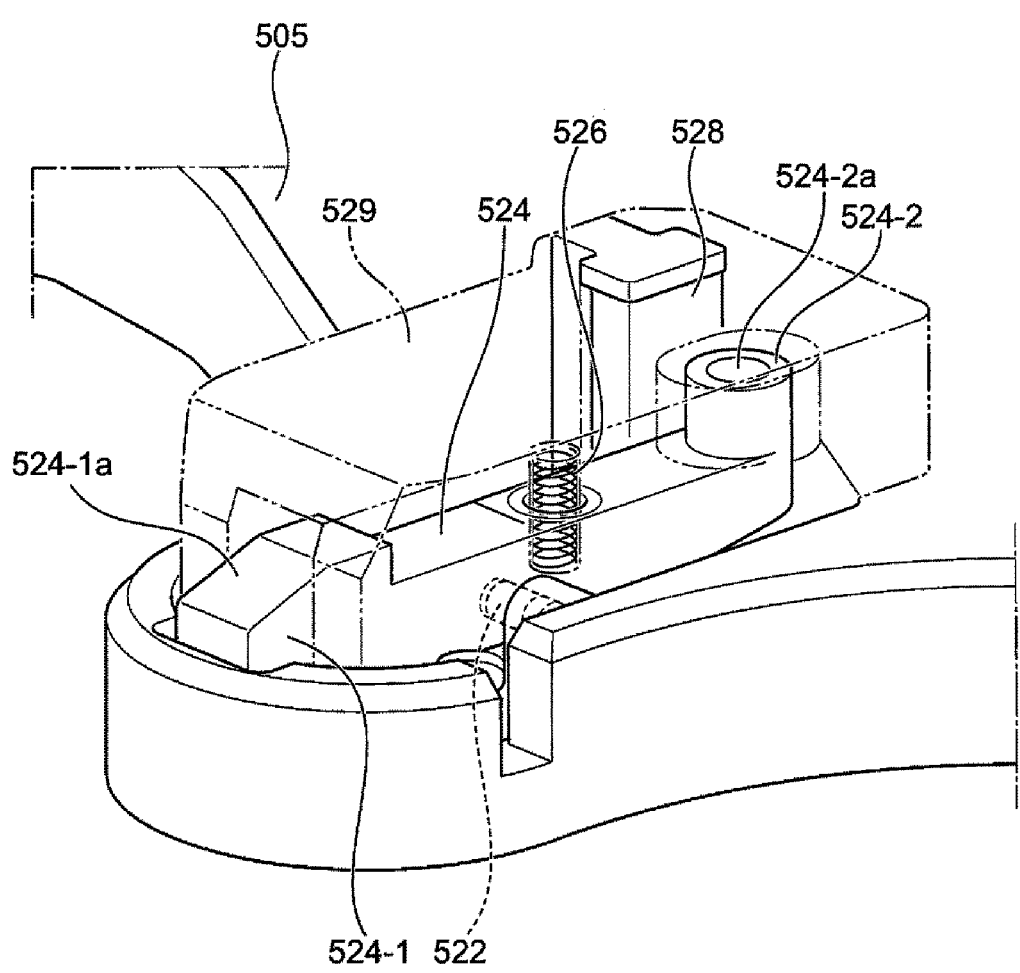
FIG. 12 is an enlarged perspective view of a lever-type seating member of the exchanger.

Subsequently, the exchanger will be described. Since the above-described exchangers 52a, 52b, and 52c have the same configuration, the exchanger 52a will be described in the following description. FIG. 10 is a perspective view of the exchanger. FIG. 11 is a plan view of the pusher and the exchanger. FIG. 12 is an enlarged perspective view of the lever-type seating member of the exchanger.

As illustrated in FIG. 10, the exchanger 52a includes a plate-shaped exchanger body 505 and a plurality (four in the embodiment) of seating members 510 attached to the exchanger body 505. As illustrated in FIG. 11, the exchanger body 505 has a substantially U shape so as not to interfere with the seating member 630.

The seating member 510 includes a plurality (three in the embodiment) of lever-type seating members 520, and one fixed seating member 530. The fixed seating member 530 includes an inclined surface 530a having a conical shape that guides the substrate to the seating area when the exchanger 52a receives the substrate from the pusher 51a, and a seating surface 530b on which the substrate guided to the seating area by the inclined surface 530a is seated.

Meanwhile, as illustrated in FIG. 12, all the three lever-type seating members 520 include a shaft member 522 supported by the exchanger body 505 and a lever member 524 supported by the shaft member 522. The lever member 524 is a member having a rod shape and includes a first end portion 524-1 including a seating portion 524-1a on which the substrate is seated, and a second end portion 524-2 provided on a side opposite to the first end portion 524-1 with the shaft member 522 interposed therebetween. A magnet 524-2a is provided in the second end portion 524-2.

The lever-type seating member 520 includes a biasing member 526 that imparts a force to the lever member 524 to rotate the lever member 524. The biasing member 526 imparts the force to the lever member 524 to rotate the lever member 524 such that the magnet 524-2a provided in the second end portion 524-2 is moved downward. Therefore, when the substrate is not seated on the lever member 524, the second end portion 524-2 (magnet 524-2a) is in a state of being moved downward. In the embodiment, the biasing member 526 is a compression spring. Specifically, the compression spring is configured such that one end is attached to a housing 529 that covers an upper portion of the lever member 524 and the other end is attached to a hole formed in an upper surface of the lever member 524 closer to the second end portion 524-2 side from the shaft member 522. The biasing member 526 is not limited to the compression spring, and any member that imparts the biasing force to the lever member 524 can be used, and an elastic body such as rubber may be applied. Since the lever member 524 is supported by the biasing member 526, it is possible to absorb the impact when the substrate Wf is seated on the lever member 524.

The lever-type seating member 520 further includes a seating sensor 528 that detects that the substrate is seated on the exchanger 52a, and the housing 529 configured to cover the second end portion 524-2 of the lever member 524 and the seating sensor 528. The seating sensor 528 is configured to detect that the second end portion 524-2 (magnet 524-2a) is moved upward. That is, when the substrate is not seated on the lever member 524, the biasing member 526 biases the lever member 524 so that the magnet 524-2a is in a state of being positioned downward. Meanwhile, when the substrate is seated on the seating portion 524-1a of the lever member 524, the lever member 524 is rotated about the shaft member 522 due to the weight of the substrate, so that the first end portion 524-1 is moved downward and the second end portion 524-2 is moved upward. The seating sensor 528 is configured to include a magnetic sensor that detects that the magnet 524-2a is moved upward. When the magnet 524-2a is moved upward and approaches the magnetic sensor, the seating sensor 528 detects the change in magnetic resistance, thereby detecting that the second end portion 524-2 is moved upward, in other words, that the substrate is seated on the seating portion 524-1a of the lever member 524.

According to the embodiment, it is possible to increase the accuracy for the detection of the seating of the substrate with respect to the exchanger 52a. That is, in the related art, the detection of the seating is performed by using the optical sensor provided in the seating portion 524-1a. Here, since the seating portion 524-1a is at a position protruding into the seating area SA, and cleaning water used in the cleaning processing or slurry used in the polishing processing exist in the seating area SA, the light of the optical sensor was diffusely reflected by the cleaning water or the slurry, which may cause erroneous detection of the seating of the substrate. In contrast, in the embodiment, the lever-type seating sensor 520 is configured to detect the seating by detecting the upward movement of the magnet 524-2a. The magnet 524-2a is on the side opposite to the first end portion 524-1 including the seating portion 524-1a with the shaft member 522 interposed therebetween so as to be separated from the seating area SA. Therefore, the magnet 634-2a is less likely to be affected by the disturbance due to the cleaning water or the slurry, and thus, it is possible to increase the accuracy for the detection of the seating of the substrate. Further, in the embodiment, since the magnet 524-2a and the seating sensor 528 are covered with the housing 529, it is much less likely to be affected by the disturbance due to the cleaning water or the slurry, and thus, it is possible to increase the accuracy for the detection of the seating of the substrate.

Further, according to the embodiment, since the pusher 51a includes the seating member 630 or the seating member 650, and the exchanger 52a includes the seating member 510, it is easy to grasp the real-time position of the substrate Wf. That is, in the related art, the detection of the seating of the substrate Wf is performed by using the optical sensor, it becomes unclear how many substrates Wf are staying in the seating detection area. Therefore, two substrates may be delivered in an overlapped state. In contrast, according to the embodiment, since the detection of the seating may be performed in the pusher 51a and the exchanger 52a, respectively, the real-time position that indicates the position of the substrate Wf within the transfer range of both driving systems may be easily grasped.

Further, when the detection of the seating is performed in either one of the pusher 51a and the exchanger 52a, for example, when the pusher 51a is raised so as to partly lift the substrate Wf on the exchanger 52a, the abnormality may not be detected. With regard to this, according to the embodiment, since the detection of the seating is performed in the pusher 51a and the exchanger 52a, respectively, after simple positioning to the extent that they are not interfered with each other mechanically, it is possible to deliver the substrate Wf by adjusting the center position so that the detection of the seating is performed normally in both the pusher 51a and the exchanger 52a. Further, since the behavior of the substrate Wf during the transfer may be grasped (e.g., since if a part of the seating sensors are turned off during the transfer, impact to a greater or lesser degree is applied when the substrate Wf is floated and fallen), it is also possible to automatically adjust the transfer so as not to damage the substrate Wf, such as by reducing the acceleration at the location. Further, when the detection of the seating of the substrate Wf is performed by using the optical sensor, photocorrosion may occur in the substrate Wf. However, the embodiment does not use the optical sensor, it is possible to prevent the occurrence of photocorrosion.

(Substrate Transfer Method)

Figure 13:
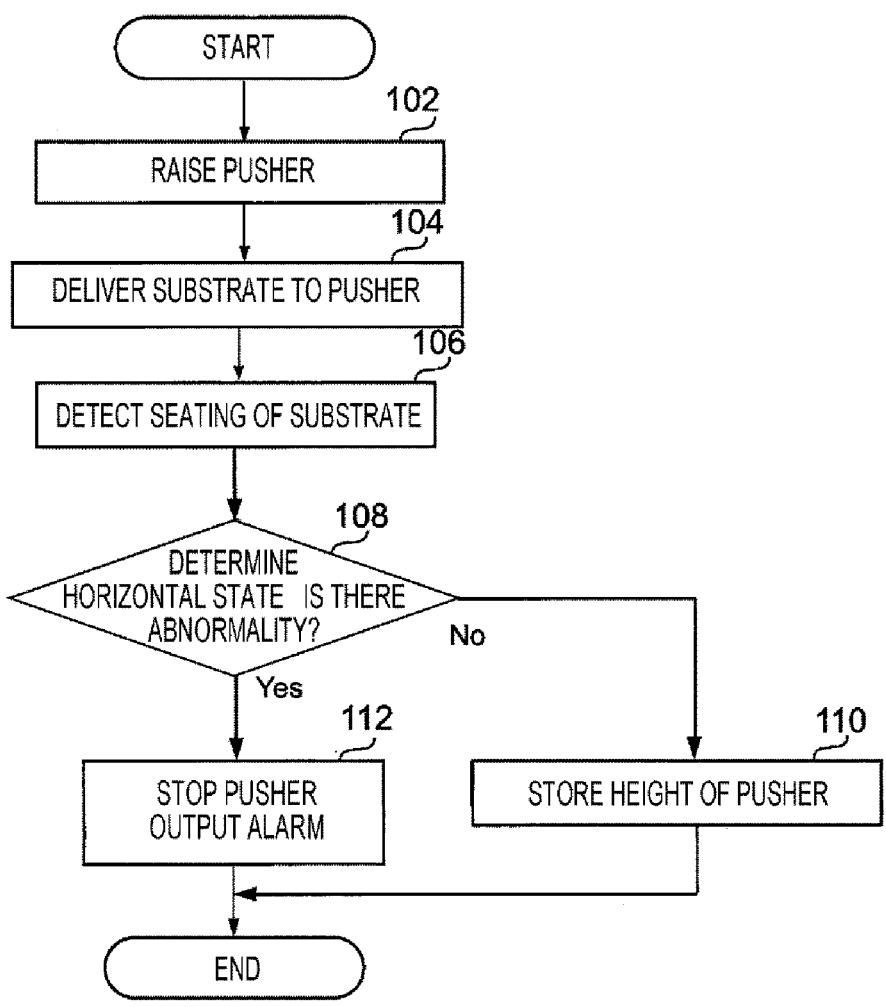
FIG. 13 is a flowchart of a substrate transfer method.

As illustrated in FIG. 11, the first transfer device 24a includes a determination member 240 that determines whether an abnormality occurs in the pusher 51a or the exchanger 52a by using the detection of the seating described above. The determination member 240 includes a storage medium 250. In the storage medium 250, in addition to various data used in the first transfer device 24a, a program that executes a processing by the determination member 240 described below may be stored. The determination member 240 may read and execute the program stored in the storage medium 250. Hereinafter, details of the processing of the determination member 240 will be described using the substrate transfer method of the embodiment. FIG. 13 is a flowchart of a substrate transfer method. As an example, FIG. 13 illustrates a flow for determining the horizontal state of the pusher 51a or the exchanger 52a when the substrate that is held and supported by the exchanger 52a is delivered to the pusher 51a.

In the substrate transfer method, the pusher 51a is raised in a state where the substrate is held and supported by the exchanger 52a (step 102). Subsequently, in the substrate transfer method, the three seating members 630 hold and support the substrate and the substrate is delivered to the pusher 51a (delivering step 104). Subsequently, in the substrate transfer method, the seating of the substrate is detected by the seating sensor 638 based on the movement of the magnet 634-2a when the substrate is delivered to the pusher 51a (detecting step 106).

Subsequently, the determination member 240 determines the horizontal state of the pusher 51a or the exchanger 52a based on the deviation in the timing of the seating of the substrate with respect to the three seating members 630 detected by detecting step 106 (determining step 108). This determination is a determination based on the fact that, when the pusher 51a or the exchanger 52a is tilted, there will be a large deviation in the timing of the seating of the substrate with respect to the three seating members 630. Specifically, the determination member 240 determines that there is no abnormality in the horizontal state of the pusher 51a or the exchanger 52a when, after first one of the three seating members 630 detects the seating, the time until all the seating members 630 (the remaining two seating members 630) detect the seating is less than a predetermined threshold. Meanwhile, the determination member 240 determines that there is an abnormality in the horizontal state of the pusher 51a or the exchanger 52a when, after first one of the three seating members 630 detects the seating, the time until all the seating members 630 (the remaining two seating members 630) detect the seating is equal to or more than a predetermined threshold.

When it is determined that there is no abnormality in the horizontal state of the pusher 51a or the exchanger 52a (No in determining step 108), the determination member 240 stores the height of the pusher 51a when the seating of the substrate is detected by detecting step 106 (when the three seating members 630 detect the seating of the substrate) as a reference height (storing step 110). Storing step 110 is used in abnormality determining (to be described in FIG. 14), and is executed for the pusher 51a serving as a reference. Storing step 110 is not executed other than the pusher 51a serving as a reference.

Meanwhile, when it is determined that there is an abnormality in the horizontal state of the pusher 51a or the exchanger 52a (Yes in determining step 108), the determination member 240 stops the operation of the pusher 51a and outputs an alarm to prompt the user to adjust the level of the pusher 51a or the exchanger 52a (step 112).

According to the substrate transfer method of the embodiment, it is possible to accurately determine whether there is an abnormality in the horizontal state of the pusher 51a or the exchanger 52a by the determination member 240. That is, as described above, the pusher 51a of the embodiment may accurately detect the seating of the substrate by using the three seating members 630. Therefore, it is possible to improve the accuracy of the determination of the horizontal state of the pusher 51a or the exchanger 52a based on the detection of the seating of the substrate.

The flowchart in FIG. 13 illustrates the determination of the horizontal state when the substrate is delivered from the exchanger 52a to the pusher 51a, but the flowchart is not limited thereto. For example, the horizontal state may be determined based on the deviation in timing of the leaving of the substrate from the pusher 51a in delivering step in which the exchanger 52a receives the substrate from the pusher 51a.

Figure 14:
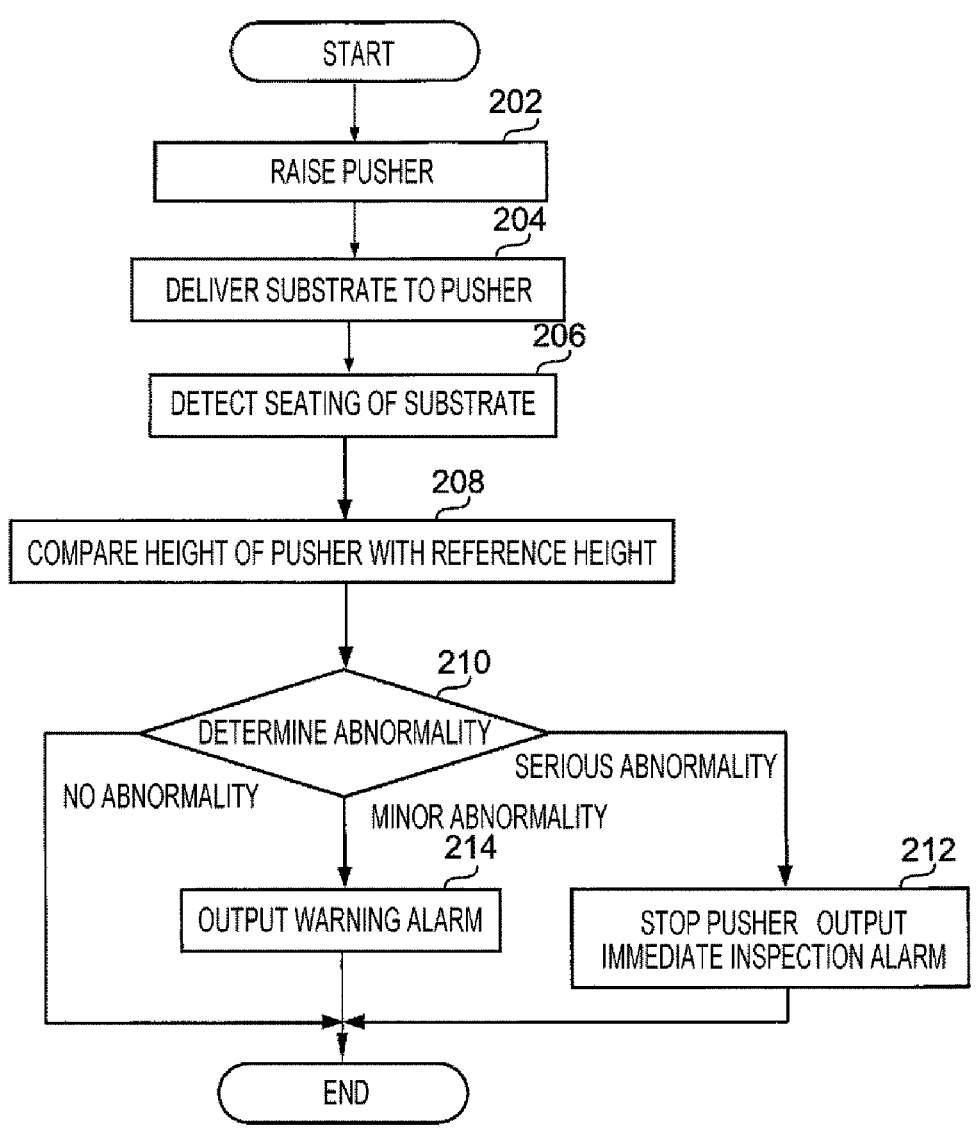
FIG. 14 is a flowchart of the substrate transfer method.

FIG. 14 is a flowchart of the substrate transfer method. As an example, FIG. 14 illustrates a flow for detecting an abnormality of the pusher 51a or the exchanger 52a when the substrate that is held and supported by the exchanger 52a is delivered to the pusher 51a. In the substrate transfer method, the pusher 51a is raised in a state where the substrate is held and supported by the exchanger 52a (step 202). Subsequently, in the substrate transfer method, the three seating members 630 hold and support the substrate and the substrate is delivered to the pusher 51a (delivering step 204). Subsequently, in the substrate transfer method, the seating of the substrate is detected by the seating sensor 638 based on the movement of the magnet 634-2a when the substrate is delivered to the pusher 51a (detecting step 206).

Subsequently, the determination member 240 compares the height of the pusher 51a when the seating of the substrate is detected with respect to each of the three seating members 630 with the reference height (comparing step 208). Subsequently, the determination member 240 determines whether the pusher 51a or the exchanger 52a has an abnormality based on the comparison result in comparing step 208 (abnormality determining step 210).

Specifically, the determination member 240 determines that the pusher 51a or the exchanger 52a has a serious abnormality when the deviation in the height of the pusher 51a with respect to the reference height is equal to or greater than a predetermined threshold when the seating of the substrate is detected with respect to at least one of the three seating members 630. That is, when the height of the pusher 51a is largely deviated with respect to the reference height, it may be considered that some kind of serious abnormality has occurred in the pusher 51a or the exchanger 52a. In this case, the determination member 240 stops the operation of the pusher 51a, and outputs an alarm to prompt the user to immediately inspect the pusher 51a or the exchanger 52a (step 212).

Meanwhile, the determination member 240 detects that the pusher 51a or the exchanger 52a has a minor abnormality when the deviation in the height of the pusher 51a with respect to the reference height is smaller than a predetermined threshold when the seating of the substrate is detected with respect to each of the three seating members 630, and when the deviation increases each time when delivering step 204 is performed. That is, when the deviation in the height of the pusher 51a with respect to the reference height is small, but the deviation increases in proportion to the number of times of the delivery of the substrate, it may be considered that some kind of minor abnormality such as loosening of screws between components of the pusher 51a or the exchanger 52a has occurred. In this case, the determination member 240 continues the operation of the pusher, and outputs an alarm to prompt the user to inspect the pusher 51a or the exchanger 52a (step 214).

Meanwhile, the determination member 240 determines that there is no abnormality in the pusher 51a or the exchanger 52a when the deviation in the height of the pusher 51a with respect to the reference height is smaller than a predetermined threshold when the seating of the substrate is detected with respect to each of the three seating members 630, and when the deviation is not increased each time when delivering step 204 is performed.

According to the substrate transfer method of the embodiment, it is possible to accurately detect an abnormality of the pusher 51a or the exchanger 52a by the determination member 240. That is, as described above, the pusher 51a of the embodiment may accurately detect the seating of the substrate by using the three seating members 630. Therefore, it is possible to improve the accuracy of the determination of the abnormality of the pusher 51a or the exchanger 52a based on the detection of the seating of the substrate.

The flowchart in FIG. 14 illustrates the determination of the abnormality when the substrate is delivered from the exchanger 52a to the pusher 51a, but the flowchart is not limited thereto. For example, the abnormality may be detected by comparing the height of the pusher when the leaving of the substrate of the pusher 51a is detected in delivering step in which the exchanger 52a receives the substrate from the pusher 51a and the reference height. Further, it is possible to perform the abnormal determination for the exchanger 52a in the same manner not only when the substrate is transferred between the exchanger 52a and the pusher 51a, but also when the substrate that is held and supported by the transfer robot 23 is delivered to the exchanger 52a.

Although some embodiments of the embodiments of the present disclosure have been described in the above, but the embodiments of the present disclosure are intended to facilitate understanding of the present disclosure, and do not limit the present disclosure. The present disclosure may be modified and improved without departing from its spirit, and the present disclosure includes equivalents thereof. Further, any combination or omission of each component described in the claims and the specification is possible within the range that at least part of the problems described above can be solved, or the range that at least part of the effect is exhibited.

The present disclosure discloses a pusher that holds and supports a substrate as an embodiment including a pusher body, and a plurality of seating members that is attached to the pusher body and on which a substrate is seated. Each of the plurality of seating members includes: a pedestal member including a seating portion on which the substrate is seated and a magnet disposed at a position different from the seating portion, and supported by the pusher body so that the position of the magnet is moved according to seating or leaving of the substrate; a seating sensor configured to detect movement of the magnet; and a magnetic member disposed to shield a part of a portion between a movable region of the magnet and the seating sensor.

Further, in the pusher disclosed in the present disclosure as an embodiment, the plurality of seating members includes a shaft member supported by the pusher body, the pedestal member includes a lever member supported by the shaft member, the lever member includes a first end portion having the seating portion and a second end portion provided on a side opposite to the first end portion with the shaft member interposed therebetween, and the magnet is provided in the second end portion, and the plurality of seating members include a biasing member configured to impart a force to the lever member to rotate the lever member about the shaft member such that the magnet is moved downward.

Further, in the pusher disclosed in the present disclosure as an embodiment, the plurality of seating members include a housing configured to cover the second end portion of the lever member and the seating sensor.

Further, in the pusher disclosed in the present disclosure as an embodiment, the plurality of seating members are attached to the pusher body at a predetermined interval so as to surround a seating area in which the substrate is seated, and the lever member is supported by the shaft member such that the first end portion protrudes into the seating area.

Further, in the pusher disclosed in the present disclosure as an embodiment, the pedestal member includes a seating pin extending in a vertical direction, the seating pin includes a first end portion having the seating portion and a second end portion positioned below the first end portion, and the magnet is provided in the second end portion, and the plurality of seating members include an elastic member that supports the seating pin so as to be movable in the vertical direction.

Further, the present disclosure discloses a transfer device as an embodiment, including: the pusher disclosed above, and a determination member configured to determine a horizontal state of the pusher based on a deviation in a timing of seating or leaving of a substrate detected by a plurality of seating members.

Further, in the transfer device disclosed in the present disclosure as an example, the transfer device includes: an elevation driving mechanism configured to move the pusher up and down; an exchanger configured to deliver a substrate to and from the pusher; and a driving mechanism configured to move the exchanger in a direction perpendicular to an elevation direction of the pusher. The exchanger includes an exchanger body, and a plurality of lever-type seating members that is attached to the exchanger body and on which a substrate is seated. Each of the plurality of lever-type seating members includes: a shaft member supported by the exchanger body; a lever member supported by the shaft member, including a first end portion having a seating portion and a second end portion provided on a side opposite to the first end portion with the shaft member interposed therebetween, and provided with a magnet in the second end portion; a biasing member configured to impart a force to the lever member to rotate the lever member about the shaft member such that the magnet is moved downward; and a seating sensor configured to detect that the magnet is moved upward.

Further, in the transfer device disclosed in the present disclosure as an embodiment, the determination member is configured to determine a horizontal state of the pusher or the exchanger based on a deviation in a timing of seating or leaving of the substrate when the substrate that is held and supported by the exchanger is delivered to the pusher, or when the exchanger receives the substrate from the pusher.

Further, in the transfer device disclosed in the present disclosure as an embodiment, the determination member is configured to determine whether the pusher or the exchanger is abnormal or not based on a comparison result obtained by comparing a reference height of the pushed when seating or leaving of the substrate is detected with respect to the pusher serving as a reference and a height of the pusher when seating or leaving of the substrate is detected with respect to each of the plurality of seating member.

Further, in the transfer device disclosed in the present disclosure as an embodiment, the determination member determines that the pusher or the exchanger has a serious abnormality when a deviation in a height of the pusher with respect to the reference height is equal to or greater than to a predetermined threshold when seating or leaving of the substrate is detected with respect to at least one of the plurality of seating members.

Further, in the transfer device disclosed in the present disclosure as an embodiment, the determination member determines that the pusher or the exchanger has a minor abnormality when a deviation in a height of the pusher with respect to the reference height is smaller than a predetermined threshold when seating or leaving of the substrate is detected with respect to each of the plurality of seating members, and when the deviation increases each time when the seating or the leaving of the substrate is performed.

Further, the present disclosure discloses a substrate processing apparatus as an embodiment, including: a polishing device configured to polish a substrate; a cleaning device configured to clean the substrate; and the transfer device disclosed above configured to transfer the substrate processed in the polishing device or in the cleaning device.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A pusher that holds a substrate, the pusher comprising:
a pusher body; and
a plurality of seating supports that is attached to the pusher body and on which a substrate is seated,
wherein each of the plurality of seating supports includes:
a pedestal including a seating portion on which the substrate is seated, and a magnet disposed at a position different from the seating portion and supported by the pusher body such that the magnet is moved according to seating or retreating of the substrate;
a seating sensor configured to detect movement of the magnet; and
a magnetic shield plate disposed to shield a portion between a movable region of the magnet and the seating sensor.

2. The pusher according to claim 1, wherein the plurality of seating supports includes a shaft supported by the pusher body,
the pedestal includes a lever supported by the shaft, the lever including a first end portion having the seating portion and a second end portion provided on a side opposite to the first end portion with the shaft interposed therebetween, and being provided with the magnet in the second end portion, and
the plurality of seating supports include an elastic body that imparts a force to the lever to rotate the lever about the shaft such that the magnet is moved downward.

3. The pusher according to claim 2, wherein the plurality of seating supports include a housing that covers the second end portion of the lever and the seating sensor.

4. The pusher according to claim 2, wherein the plurality of seating supports are attached to the pusher body at a predetermined interval so as to surround a seating region where the substrate is seated, and
the lever is supported by the shaft such that the first end portion protrudes into the seating region.

5. The pusher according to claim 1, wherein the pedestal includes a seating pin extending in a vertical direction, the seating pin including a first end portion having the seating portion and a second end portion positioned below the first end portion, and being provided with the magnet in the second end portion, and
the plurality of seating supports include an elastic member that supports the seating pin so as to be movable in the vertical direction.

6. A transfer device comprising:
the pusher according to claim 1, and
a determination controller configured to determine a horizontal state of the pusher based on a deviation in a timing of seating or retreating of a substrate detected by the plurality of seating supports.

7. The transfer device according to claim 6, further comprising:
an elevation driver configured to move the pusher up and down;
an exchanger configured to deliver a substrate to and from the pusher; and
a driver configured to move the exchanger in a direction perpendicular to an elevation direction of the pusher,
wherein the exchanger includes an exchanger body, and a plurality of lever-type seating supports attached to the exchanger body and configured to accommodate a substrate,
each of the plurality of lever-type seating supports includes:
a shaft supported by the exchanger body;
a lever supported by the shaft, including a first end portion having a seating portion and a second end portion provided on a side opposite to the first end portion with the shaft interposed therebetween, and provided with a magnet in the second end portion;
an elastic body configured to impart a force to the lever to rotate the lever about the shaft such that the magnet is moved downward; and
a seating sensor configured to detect that the magnet is moved upward.

8. The transfer device according to claim 7, wherein the determination controller is configured to determine a horizontal state of the pusher or the exchanger based on a deviation in a timing of seating or retreating of the substrate when the substrate held by the exchanger is delivered to the pusher, or when the exchanger receives the substrate from the pusher.

9. The transfer device according to claim 8, wherein the determination controller is configured to determine whether the pusher or the exchanger is abnormal based on a comparison result obtained by comparing a reference height of the pusher when seating or retreating of the substrate is detected with respect to the pusher serving as a reference and a height of the pusher when seating or retreating of the substrate is detected with respect to each of the plurality of seating support.

10. The transfer device according to claim 9, wherein the determination controller determines that the pusher or the exchanger has a serious abnormality when a deviation in a height of the pusher with respect to the reference height is equal to or greater than to a predetermined threshold when seating or retreating of the substrate is detected with respect to at least one of the plurality of seating supports.

11. The transfer device according to claim 9, wherein the determination controller determines that the pusher or the exchanger has a minor abnormality when a deviation in a height of the pusher with respect to the reference height is smaller than a predetermined threshold when seating or retreating of the substrate is detected with respect to each of the plurality of seating supports, and when the deviation increases each time when the seating or retreating of the substrate is performed.

12. A substrate processing apparatus comprising:

a polishing device configured to polish a substrate;

a cleaning device configured to clean the substrate; and the transfer device according to claim 6 configured to transfer the substrate processed in the polishing device or in the cleaning device.

\* \* \* \* \*